(12) United States Patent
Ito

(10) Patent No.: US 8,950,414 B2
(45) Date of Patent: Feb. 10, 2015

(54) LIQUID PROCESSING APPARATUS, LIQUID PROCESSING METHOD, AND STORAGE MEDIUM

(75) Inventor: Norihiro Ito, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 731 days.

(21) Appl. No.: 12/837,840

(22) Filed: Jul. 16, 2010

(65) Prior Publication Data

US 2011/0023909 A1 Feb. 3, 2011

(30) Foreign Application Priority Data

Jul. 31, 2009 (JP) .................................. 2009-179283
Jul. 31, 2009 (JP) .................................. 2009-179456
Jul. 31, 2009 (JP) .................................. 2009-179479

(51) Int. Cl.
*H01L 21/00* (2006.01)
*H01L 21/67* (2006.01)

(52) U.S. Cl.
CPC ...... *H01L 21/6708* (2013.01); *H01L 21/67051* (2013.01); *H01L 21/67248* (2013.01); *Y10S 134/902* (2013.01)
USPC .......... 134/95.3; 134/103.1; 134/902; 134/43

(58) Field of Classification Search
CPC ..................... H01L 21/6708; H01L 21/67051; H01L 21/67248
USPC .............. 134/94.1, 95.1, 95.3, 43, 902, 103.1
See application file for complete search history.

(56) References Cited

U.S. PATENT DOCUMENTS

| 4,027,686 | A | * | 6/1977 | Shortes et al. ................... 134/33 |
| 4,564,280 | A | * | 1/1986 | Fukuda ......................... 396/611 |
| 5,707,007 | A | * | 1/1998 | Fiedrich .......................... 237/81 |
| 5,778,911 | A | | 7/1998 | Yoshio |
| 5,782,990 | A | * | 7/1998 | Murakami et al. .............. 134/26 |
| 5,944,894 | A | * | 8/1999 | Kitano et al. .................. 118/326 |
| 6,200,414 | B1 | | 3/2001 | Hwang et al. |

(Continued)

FOREIGN PATENT DOCUMENTS

DE 102006002389 A1 * 7/2007
JP 02-138427 U 11/1990

(Continued)

OTHER PUBLICATIONS

Machine translation of DE 102006002389, dated Jul. 19, 2007.*

(Continued)

*Primary Examiner* — Joseph L Perrin
*Assistant Examiner* — Kevin G Lee
(74) *Attorney, Agent, or Firm* — Burr & Brown, PLLC

(57) ABSTRACT

The liquid processing apparatus includes: a liquid supply mechanism; a supply line connected to the liquid supply mechanism, the supply line having a discharge opening for discharging a temperature-regulated liquid; a processing unit supporting the discharge opening of the supply line; a return line configured to return the liquid supplied to the supply line to the liquid supply mechanism; and a liquid-supply switching valve configured to switch between supply of the liquid, which is used in a processing of an object to be processed in the processing unit, and stoppage of the liquid supply. The liquid-supply switching valve is disposed on the supply line on a route of the liquid returning from the supply line to the liquid supply mechanism through the return line.

4 Claims, 7 Drawing Sheets

(56) References Cited

U.S. PATENT DOCUMENTS

| | | | |
|---|---|---|---|
| 6,474,561 B2* | 11/2002 | Maruyama | 237/70 |
| 6,589,338 B1 | 7/2003 | Nakamori et al. | |
| 6,858,091 B2* | 2/2005 | Boyd et al. | 134/26 |
| 6,878,303 B2* | 4/2005 | Okamoto | 216/93 |
| 6,982,006 B1* | 1/2006 | Boyers et al. | 134/3 |
| 7,055,535 B2* | 6/2006 | Kunisawa et al. | 134/157 |
| 7,591,922 B2* | 9/2009 | Okamoto | 156/345.18 |
| 7,697,110 B2* | 4/2010 | Nagasaka et al. | 355/30 |
| 2004/0065540 A1* | 4/2004 | Mayer et al. | 204/198 |
| 2005/0178401 A1* | 8/2005 | Boyers | 134/1.3 |
| 2006/0107976 A1* | 5/2006 | Boyers et al. | 134/94.1 |
| 2006/0213763 A1* | 9/2006 | Furuya et al. | 204/192.1 |
| 2010/0310765 A1* | 12/2010 | Olsson et al. | 427/207.1 |

FOREIGN PATENT DOCUMENTS

| | | |
|---|---|---|
| JP | 08-108125 A1 | 4/1996 |
| JP | 10-303163 A1 | 11/1998 |
| JP | 10-303164 A1 | 11/1998 |
| JP | 11-260788 A1 | 9/1999 |
| JP | 11-307510 A1 | 11/1999 |
| JP | 2001-160546 A1 | 6/2001 |
| JP | 2003-017453 | 1/2003 |
| JP | 2006-269668 A1 | 10/2006 |
| JP | 2007-123393 A1 | 5/2007 |
| JP | 2007-311446 A1 | 11/2007 |
| JP | 2008-066505 A1 | 3/2008 |
| JP | 2009-148734 | 7/2009 |

OTHER PUBLICATIONS

Japanese Office Action dated Nov. 20, 2012.

Japanese Office Action, Japanese Patent Application No. 2009-179479, dated Dec. 14, 2012 (2 pages).

Japanese Office Action dated Feb. 8, 2013.

* cited by examiner

LIQUID PROCESSING APPARATUS, LIQUID PROCESSING METHOD, AND STORAGE MEDIUM

CROSS REFERENCE TO RELATED APPLICATIONS

This application is based upon and claims the benefit of priority from the prior Japanese Patent Application No. 2009-179283 filed on Jul. 31, 2009, No. 2009-179456 filed on Jul. 31, 2009, and No. 2009-179479 filed on Jul. 31, 2009, the entire contents of which are incorporated herein by reference.

BACKGROUND OF THE INVENTION

1. Field of the Invention

The present invention relates to a liquid processing apparatus and a liquid processing method, which are configured to process an object to be processed by using a temperature-regulated liquid. In addition, the present invention relates to a storage medium storing a program for performing the liquid processing method configured to process an object to be processed by using a temperature-regulated liquid.

2. Description of Related Art

There has been generally, conventionally employed a technique for processing an object to be processed while supplying the object to be processed with a temperature-regulated liquid, such as an etching process for etching a semiconductor wafer (hereinafter referred to simply as "wafer") or a glass substrate for display (e.g., JP2007-123393A). In general, when the temperature of a liquid for use in a process is high, reaction caused by the liquid is activated, which accelerate the process. Thus, heating of the liquid used in the processing offers such an advantage as reduction of the process period.

In addition, the inventors of the present invention have found that, when a drying liquid typified by IPA (isopropyl alcohol) is heated, such a heated liquid can be advantageously used in a drying process of an object to be processed such as a wafer. To be specific, when a heated drying liquid is used in a drying process of an object to be processed, an endothermic amount from the object to be processed is decreased upon evaporation of the drying liquid, whereby lowering of the temperature of the object to be processed can be restrained during the drying process. Thus, dew condensation on the object to be processed can be restrained, and generation of watermarks on the object to be processed can be effectively prevented.

When the temperature of the liquid used for processing the object to be processed is regulated, the progress of the process largely varies depending on the temperature of the liquid, as described above. Thus, it is important to maintain constant the temperature of the liquid used in the process, in order to ensure the uniform process.

JP2007-123393A discloses a substrate processing apparatus including: a tank storing a chemical liquid; a main pipeline (supply pipeline 163 for chemical liquid process) whose one end is connected to the tank; a plurality of supply pipelines (supply pipelines 64, 83 for chemical liquid process) branched from the other end of the main pipeline; and a plurality of processing units connected to the supply pipelines. In this substrate processing apparatus, a temperature regulating mechanism for regulating the temperature of a chemical liquid is disposed on the main pipeline, and the respective supply pipelines are provided with valves. By opening and closing the valves, a temperature-regulated chemical liquid is supplied to the respective processing units.

In this conventional substrate processing apparatus, when the valve is closed, the temperature-regulated chemical liquid will not flow through the supply pipeline. For example, in a case where the liquid is heated by regulating the temperature, when the process in the processing unit is stopped, i.e., when the supply of the heated liquid into the processing unit is stopped, the temperature of the supply pipeline lowers. Thus, upon restart of the supply of the heated liquid into the processing unit, the heat of the heated liquid is absorbed by the supply pipeline whose temperature has lowered, so that the temperature of the supplied liquid to be used for the process lowers.

In particular, as compared with the pipeline, the valve provided on the supply pipeline has a significantly larger heat capacity. Thus, while the supply of the temperature-regulated liquid into the processing unit is being stopped, if the temperature of the valve as well as the temperature of the supply pipeline vary (e.g., lower), the temperature of the liquid largely varies upon restart of the supply of the liquid into the processing unit. As a result, the process to the object to be processed may become unstable.

SUMMARY OF THE INVENTION

A liquid processing apparatus according to one aspect of the present invention is a liquid processing apparatus configured to process an object to be processed by using a temperature-regulated liquid, the liquid processing apparatus comprising:
 a liquid supply mechanism configured to supply a liquid;
 a supply line connected to the liquid supply mechanism, the supply line having a discharge opening for discharging the temperature-regulated liquid;
 a processing unit supporting the supply line, the processing unit being configured to be capable of processing the object to be processed by using the temperature-regulated liquid discharged from the discharge opening of the supply line;
 a return line configured to return the liquid supplied to the supply line to the liquid supply mechanism; and
 a liquid-supply switching valve disposed on the supply line, the liquid-supply switching valve being configured to switch between supply of the liquid, which is used in the processing of the object to be processed in the processing unit, to the discharge opening, and stoppage of the liquid supply;
 wherein the liquid-supply switching valve is located on a route of the liquid returning from the supply line to the liquid supply mechanism through the return line.

A liquid processing method according to one aspect of the present invention is a liquid processing method configured to process an object to be processed by using a temperature-regulated liquid, the liquid processing method comprising:
 regulating a temperature of the supply line by returning a temperature-regulated liquid, which has flowed from a liquid supply mechanism into a supply line, to the liquid supply mechanism through a return line, so that the temperature-regulated liquid circulates through a route including the supply line and the return line; and
 discharging the temperature-regulated liquid, which has flowed from the liquid supply mechanism into the supply line, from a discharge opening of the supply line, so as to process the object to be processed;
 wherein, during the temperature regulation of the supply line, a temperature of a liquid-supply switching valve is also regulated, the liquid-supply switching valve being disposed on the supply line and configured to switch between supply of the liquid, which is used in the processing of the object to be processed in a processing unit, to the discharge opening, and stoppage of the liquid supply.

A storage medium according to one aspect of the present invention is a storage medium storing a program executed by a control unit for controlling a liquid processing apparatus configured to process an object to be processed by using a temperature-regulated liquid, the storage medium being configured to cause the liquid processing apparatus to perform the liquid processing method, upon execution of the program by the control unit.

DETAILED DESCRIPTION OF THE INVENTION

Herebelow, embodiments of the present invention will be described with reference to the drawings. In those figures attached to the specification, the dimensions and the aspect ratios are suitably changed or exaggerated from the actual ones, in order to facilitate understanding.

Figure 1:
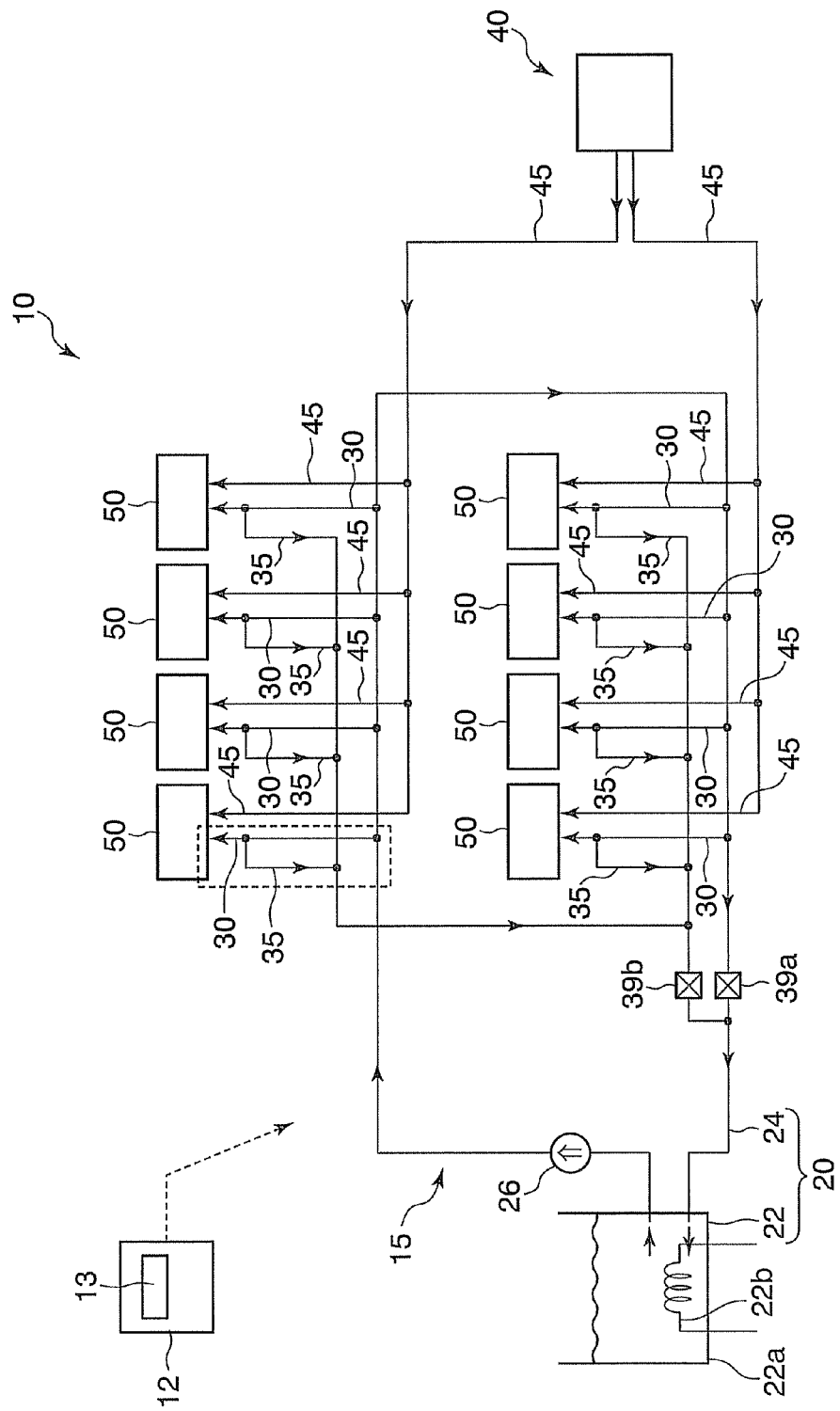
FIG. 1 is a view schematically showing an overall structure of a liquid processing apparatus in one embodiment of the present invention.
Figure 2:
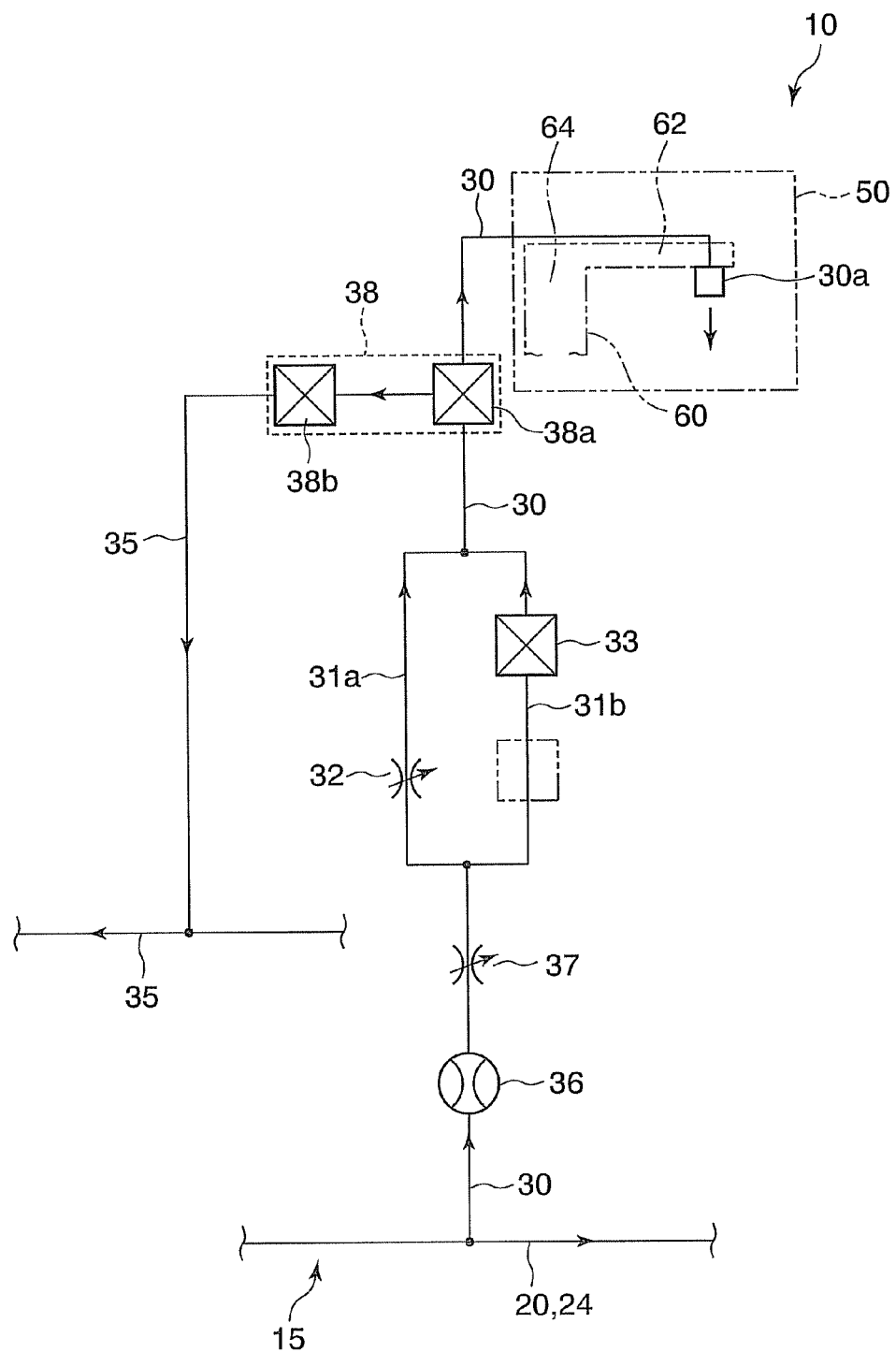
FIG. 2 is a view showing pipelines in the vicinity of a processing unit of the liquid processing apparatus shown in FIG. 1.
Figure 3:
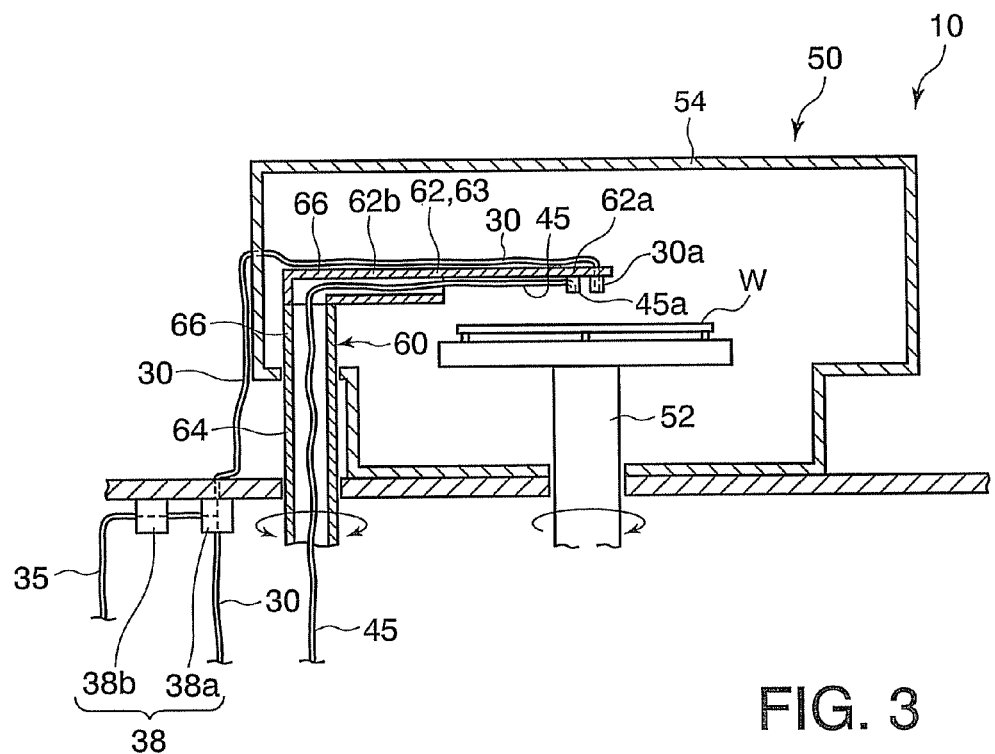
FIG. 3 is a longitudinal sectional view showing the processing unit of the liquid processing apparatus shown in FIG. 1.
Figure 4:
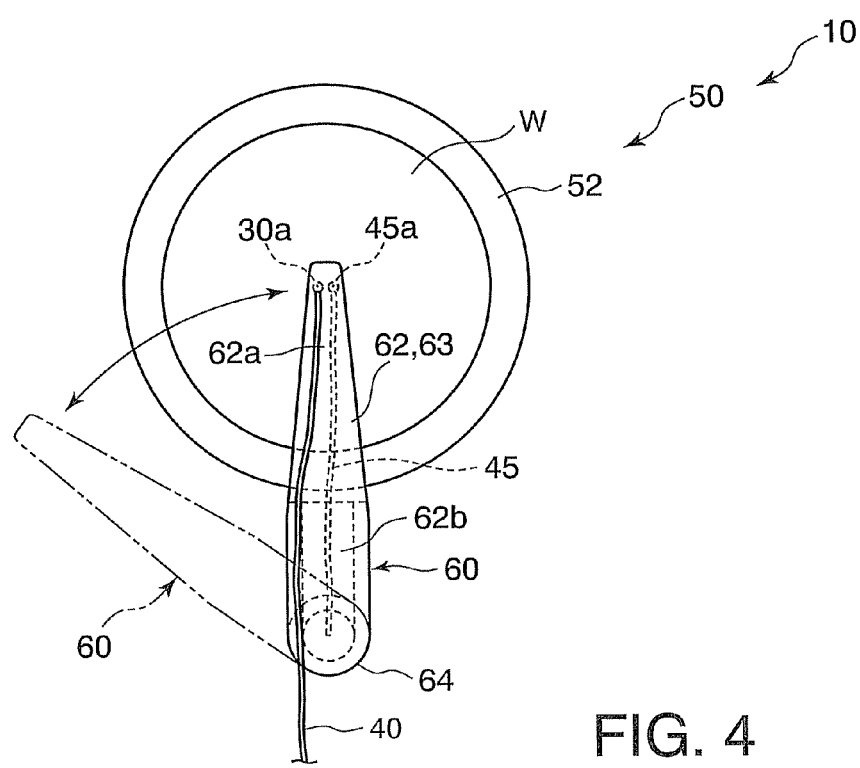
FIG. 4 is a view showing from above a supporting member of the processing unit shown in FIG. 1.
Figure 7:
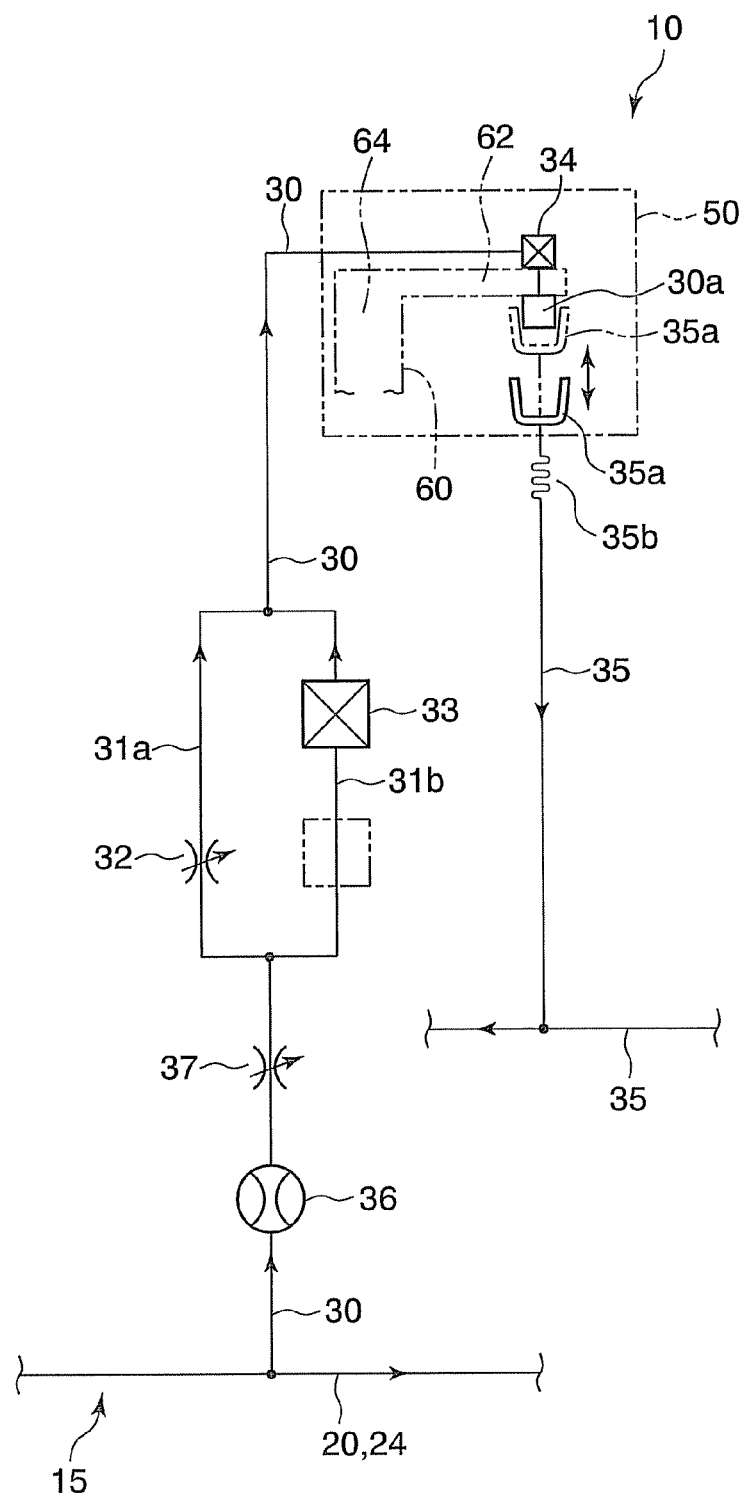
FIG. 7, which corresponds to FIG. 2, is a view showing a modification of the liquid processing apparatus.
Figure 8:
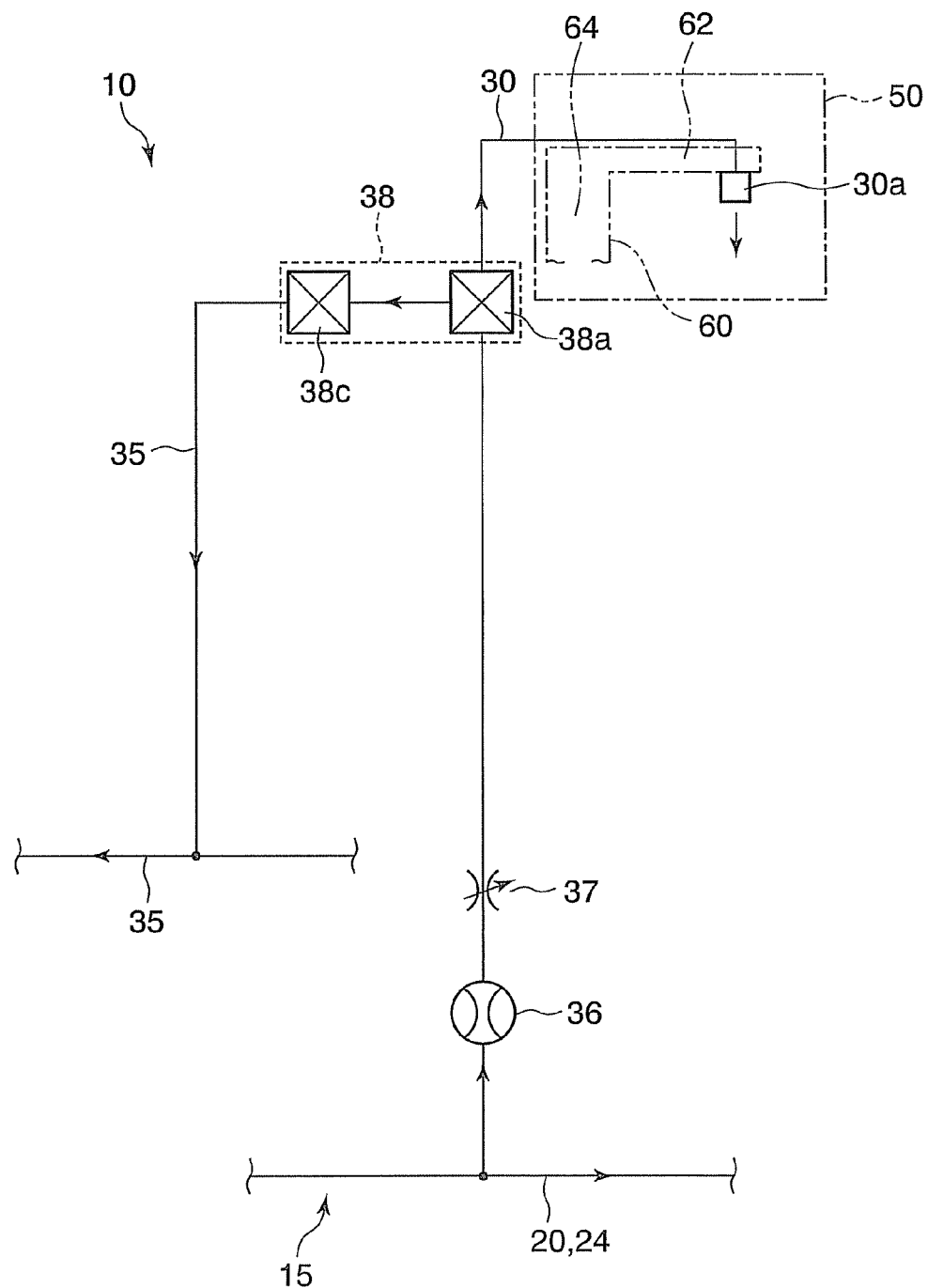
FIG. 8, which corresponds to FIG. 2, is a view showing another modification of the liquid processing apparatus.
Figure 9:
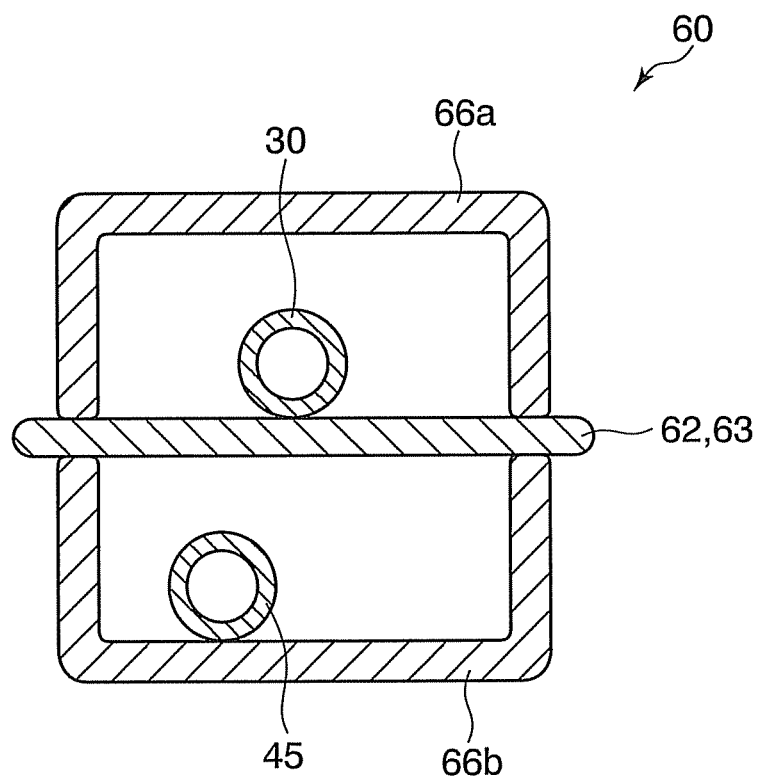
FIG. 9 is a view for explaining a modification of an arm (partition member) of the supporting member.

FIGS. 1 to 6 are views for explaining an embodiment of the present invention. FIGS. 7 to 9 are views for explaining modifications of the embodiment shown in FIGS. 1 to 6. FIG. 1 is a view schematically showing an overall structure of a liquid processing apparatus. FIG. 2 is an enlarged and detailed view of the area surrounded by the dotted lines in FIG. 1. FIGS. 3 and 4 are a longitudinal sectional view and a top view, respectively, showing one of processing units included in the liquid processing apparatus.

In the below embodiment, there is described an example in which the present invention is applied to a cleaning process of a semiconductor wafer (an example of an object to be processed). In the cleaning process, the discoid wafer as an object to be processed is subjected to a processing using a chemical liquid, a processing using a deionized water, and a processing using a drying liquid. When used, the drying liquid is heated such that the temperature of the drying liquid is higher than those of the chemical liquid and the deionized water. However, as a matter of course, the application of the present invention is not limited to the cleaning of a wafer.

As shown in FIGS. 1 to 4, the liquid processing apparatus 10 includes: a first-liquid supply mechanism 15 configured to supply a first liquid; a second-liquid supply mechanism 40 configured to supply a second liquid; a first supply line 30 whose one end is connected to the first-liquid supply mechanism 15; a second supply line 45 whose one end is connected to the second-liquid supply mechanism 40; and a processing unit 50 configured to process a wafer W by using the first liquid and the second liquid. Further, the liquid processing apparatus 10 includes a return line 35 whose one end is connected to a circulation line 20, the return lines 35 being configured to return the first liquid, which has been supplied to the first supply line 30 to the first-liquid supply mechanism 15. Furthermore, the liquid processing apparatus 10 includes a control device 12 configured to control operations of the respective constituent elements of the liquid processing apparatus 10 and flow paths of the liquids. In the illustrated example, the liquid processing apparatus 10 is equipped with a number of (e.g., eight) processing units 50. The first supply line 30 and the second supply line 45 extend into each of the processing units 50.

As shown in FIGS. 1 to 4, the liquid processing apparatus 10 includes: a first-liquid supply mechanism 15 configured to supply a first liquid; a second-liquid supply mechanism 40 configured to supply a second liquid; a first supply line 30 whose one end is connected to the first-liquid supply mechanism 15; a second supply line 45 whose one end is connected to the second-liquid supply mechanism 40; and a processing unit 50 configured to process a wafer W by using the first liquid and the second liquid. Further, the liquid processing apparatus 10 includes a return line 35 whose one end is connected to a circulation line 20, the return lines 35 being configured to return the first liquid, which has been supplied to the first supply line, 30 to the first-liquid supply mechanism 15. Furthermore, the liquid processing apparatus 10 includes a control device 12 configured to control operations of the respective constituent elements of the liquid processing appa- ratus 10 and flow paths of the liquids. In the illustrated example, the liquid processing apparatus 10 is equipped with a number of (e.g., eight) processing units 50. The first supply line 30 and the second supply line 45 are extended into each of the processing units 50.

Firstly, there is described a supply system that supplies the first liquid to the processing units 50. In the following example, a drying liquid, more specifically, IPA (isopropyl alcohol) is supplied as the first liquid.

As shown in FIG. 1, the first-liquid supply mechanism 15 has the annular circulation line 20, and a delivery mechanism (e.g., a pump) 26 disposed on the circulation line 20. The circulation line 20 has a first-liquid supply source 22 configured to supply the temperature-regulated first liquid, and a circulation path 24 through which the temperature-regulated first liquid supplied from the first-liquid supply source 22 can circulate.

The first liquid supply source 22 has a reservoir 22a capable of reserving the first liquid, and a replenish mechanism (not shown) configured to replenish the temperature-regulated first liquid to the reservoir 22a. The reservoir 22a is formed of, e.g., a tank. In order that the first liquid supplied from the first-liquid supply source 22 can circulate, opposed ends of the circulation path 24 are connected to the reservoir 22a.

The first-liquid supply mechanism 15 is adapted to supply the first liquid to the respective processing units 50 through the first supply lines 30. In accordance with consumption of the first liquid from the circulation line 20 of the first-liquid supply mechanism 15, the replenish mechanism of the first-liquid supply source 22 is adapted to replenish the first liquid to the circulation line 20. For example, the replenish mechanism may have a structure that allows the first liquid to be automatically replenished into the reservoir 22a depending on the liquid amount in the reservoir 22a.

In the illustrated example, the first-liquid supply source further has a temperature regulating mechanism 22b configured to regulate the temperature of the first liquid in the reservoir 22a. Namely, the first-liquid supply source 22 is configured not only to replenish the temperature-regulated first liquid to the circulation line 20, but also to regulate (control) the temperature of the first liquid circulating through the circulation path 24 according to need, and to again supply the temperature-regulated first liquid to the circulation path 24. As described above, in this embodiment, the temperature regulating mechanism 22b is structured as a heating mechanism, and is configured to heat the first liquid as a temperature regulation of the first liquid. Thus, in the embodiment described herebelow, the temperature regulating mechanism 22b is also referred to as the heating mechanism 22b.

The delivery mechanism 26 is formed of, e.g., a pump, and is disposed on the circulation path 24. The delivery mechanism 26 drives the first liquid such that the heated first liquid supplied from the first-liquid supply source 22 to the circulation path 24 circulates through the circulation path 24. Thus, the first liquid fed by the delivery mechanism 26 can go through the circulation line 20 and return to the delivery mechanism 26 again.

Next, the first supply line 30 and the return line 35 are described. As shown in FIG. 1, a lot of first supply lines 30 are branched from the circulation path 24 of the circulation line 20 and extended into the corresponding processing units 50. The plurality of return lines 35 are provided correspondingly to the respective first supply lines 30. Each of the return lines 35 is capable of returning the first liquid, which has flowed from the circulation line 20 to the first supply line 30, to the circulation line 20.

As shown in FIGS. 2 and 3, the first supply line 30 has a discharge opening 30a for discharging the first liquid. The discharge opening 30a is structured as a nozzle supported by an arm 62 of the processing unit 50. As described below, the heated first liquid can be discharged from the discharge opening 30a toward the wafer W as an object to be processed.

As shown in FIG. 2, the first supply line 30 is divided into a plurality of pipelines at least in one zone at a position upstream of a connection position where the first supply line 30 and the return line 35 are connected to each other. The control device 12 is configured to control an amount of the first liquid flowing from the circulation line 20 into the first supply line 30 by opening and closing the plurality of pipelines.

In the example shown in FIG. 2, the first supply line 30 is divided into two pipelines, i.e., a first pipeline 31a and a second pipeline 31b extending in parallel with the first pipeline 31a. The first pipeline 31a is provided with a flow-rate regulating valve (e.g., a needle valve) 32 whose opening degree can be manually adjusted beforehand. In addition, at a position of the first supply line 30 excluding the zone where the first supply line 30 is divided into the pipelines 31a and 31b, the position being upstream of the connection position where the first supply line 30 and the return line 35 are connected to each other, there is also provided a flow-rate regulating valve 37 whose opening degree can be manually adjusted beforehand. Further, as shown in FIG. 2, a flowmeter 36 configured to measure an amount of the first liquid flowing through the first supply line 30 is provided on the first supply line 30 near a position upstream of the flow-rate regulating valve 37.

On the other hand, the second pipeline 31b is provided with an opening and closing valve 33 whose opening and closing operation can be driven by a fluid pressure. The opening and closing valve 33 is formed of, e.g., an air-operated valve whose opening and closing operation is pneumatically driven. The opening and closing operations of the opening and closing valve 33 are controlled by the control device 12.

Due to the above structure, the first liquid can flow through the first supply line 30 at two different flow rates, only by opening and closing the opening and closing valve 33. To be specific, for example, a maximum flow rate of the first pipeline 31a is set at A (l/min) by the flow-rate regulating valve 32, and a maximum flow rate of the first supply line 30 is set at B (l/min) by the flow-rate regulating valve 37. In addition, for example, the second pipeline 31b is designed such that a liquid can flow therethrough at a flow rate not less than (B−A) (l/min). In this example, during the opening of the opening and closing valve 33, the first liquid is allowed to flow through the first supply line 30 at a flowrate of B (l/min). Meanwhile, during the closing of the opening and closing valve 33, the first liquid is allowed to flow through the first supply line 30 at a flow rate of A (l/min). Herein, the characters "A" and "B" are numerical values indicating flow rates (l/min).

On the other hand, as shown in FIGS. 2 and 3, an upstream end of each return line 35 is connected to a part of the corresponding supply line 30 via a flow-path control mechanism 38. Namely, each return line 35 is connected to the corresponding supply line 30 at a certain position between an end of the corresponding supply line 30 at which the supply line 30 is connected to the circulation line 20 and the discharge opening 30a of the corresponding supply line 30. In particular, in this embodiment, the return line 35 is connected to the corresponding supply line 30 at a position downstream of the zone where the supply line 30 is divided into the pipelines 31a and 31b. By controlling the flow-path control mechanism 38 (in more detail, the below-described liquid-supply switching valve (three-way valve 38a) of the flow-path control mechanism 38), the control device 12 can control the discharge and stoppage (not-discharge) of the first liquid from the discharge opening 30a of the first supply line 30.

In the illustrated example, the flow-path control mechanism 38 is configured to selectively maintain one of the following states. Namely, the flow-path control mechanism 38 selects the state where the liquid having flowed from the circulation line 20 into the first supply line 30 further flows through the first supply line 30 toward the discharge opening 30a, or the state where the liquid is not directed toward the discharge opening 30a but is directed toward the return line 35. As a concrete example of such a flow-path control mechanism, the illustrated flow-path control mechanism 38 has a three-way valve 38a disposed on the first supply line 30 and connected to the one end of the return line 35, and an opening and closing valve 38b disposed on the return line 35. Both the three-way valve 38a and the opening and closing valve 38b are formed of valves whose opening and closing operations can be driven by a fluid pressure, such as air-operated valves whose opening and closing operations can be pneumatically driven.

The three-way valve 38a is adapted to be maintained in the below states: a state where the upstream-side first supply line 30 (on the side of the circulation line 20) is communicated with the return line 35, or a state where the upstream-side first supply line 30 is communicated with both the return line 35 and the downstream-side first supply line 30 (on the side of the processing unit 50). That is to say, in the illustrated example, the three-way valve 38a functions as a liquid-supply switching valve that switches between supply of the liquid, which is used in the processing of the object to be processed in the processing unit, and stoppage of the liquid supply. Thus, the three-way valve 38 constituting the flow-path control mechanism 38 is also referred to as the liquid-supply switching valve 38a.

The control device 12 controls the switching operation of the liquid-supply switching valve (three-way valve) 38a for switching the two states, and the opening and closing operation of the opening and closing valve 38b. More specifically, the operations of the liquid-supply switching valve 38a and the opening and closing valve 38b are controlled as described below. When the flow-path control mechanism 38 is maintained such that the liquid having flowed from the circulation line 20 into the first supply line 30 further flows through the first supply line 30 toward the discharge opening 30a, the three ways of the liquid-supply switching valve 38a are held opened while the opening and closing valve 38b is held closed. Namely, since the three ways of the liquid-supply switching valve 38a are held opened, there is established the flow path connecting a part of the first supply line 30 which is upstream of the liquid-supply switching valve 38a, and a part of the first supply line 30 which is downstream of the liquid-supply switching valve 38b, whereby the first liquid to be used for processing the object to be processed W can be supplied into the processing unit 50.

Preferably, the opening and closing valve 38b is located adjacently to the liquid-supply switching valve 38a. This is because the first liquid will not stagnate between the three-way valve 38a and the opening and closing valve 38b, when the three ways of the liquid-supply switching valve 38a are held opened and the opening and closing valve 38b is held closed.

On the other hand, when the flow-path control mechanism 38 is maintained such that the liquid having flowed from the circulation line 20 into the first supply line 30 is directed toward the return line 35, only the two ways of the liquid-supply switching valve 38a are held opened and the opening and closing valve 38b is held opened. Namely, since the liquid-supply switching valve 38a is maintained such that the part of the first supply line 30, which is upstream of the liquid-supply switching valve 38a, is connected only to the return line 35, the flow path connecting the part of the first supply line 30, which is upstream of the liquid-supply switching valve 38a, and the part of the first supply line 30, which is downstream of the liquid-supply switching valve 38a, is closed, whereby the first liquid to be used for processing the object to be processed cannot be supplied into the processing unit 50.

In the example shown in FIG. 1, the plurality of return lines 35 are merged and connected to the circulation line 20 of the first-liquid supply mechanism 15. To be more specific, the end of the merged return lines 35 is connected to the circulation path 24 of the circulation line 20. As described above, when the plurality of return lines 35 are merged and connected to the circulation line 20, a space required for installing the plurality of return lines 35 can be effectively saved. However, not limited to this example, the plurality of return lines 35 may be independently connected to the first-liquid supply mechanism 15. Alternatively, the return lines 35 may be connected to the first-liquid supply mechanism 15 not through the circulation path 24 but through the reservoir 22a, for example, so as to return the first liquid to the reservoir 22a.

As shown in FIG. 1, the connection position where the return line 35 is connected to the circulation line 20 is located downstream of a connection position where the most downstream-side first supply line 30 of the plurality of first supply lines 30 along the circulation line 20 is connected to the circulation line 20. A first relief valve 39a is disposed on the circulation line 20 between the connection position where the return line 35 is connected to the circulation line 20 and the connection position where the most downstream-side first supply line 30 is connected to the circulation line 20. In addition, there is disposed a second relief valve 39b on the return line 35, preferably, on a position near to the connection position where the return line 35 is connected to the circulation line 20. A set pressure of the first relief valve 39a is higher than a set pressure of the second relief valve 39b. That is to say, a pressure of the first liquid in the return line 35 is set lower than a pressure of the first liquid in the circulation line 20 in an area where the circulation line 20 and the first supply lines 30 are connected to each other.

The "upstream" side and the "downstream" side of the circulation line 20 are judged based on a liquid flow of the heated first liquid in the circulation line 20 as a reference. Namely, based on the liquid flow of the first liquid, which has been supplied from the first-liquid supply source 22 to the circulation path 24, in the circulation line 20 as a reference, the connection position where the reservoir 22a is connected to the pipeline defining the circulation path 24 is the most upstream side in the circulation line 20. The direction along which the first liquid flows from the connection position (most upstream position) is the downstream direction.

Next, a supply system that supplies the second liquid to the processing unit 50 is described. As described above, the second liquid is supplied from the second-liquid supply mechanism 40. The plurality of second supply lines 45 are provided between the second-liquid supply mechanism 40 and the respective processing units 50. As shown in FIGS. 3 and 4, the second supply line 45 has a discharge opening 45a for discharging the second liquid. The discharge opening 45a is structured as a nozzle supported by the arm 62 of the processing unit 50.

In the embodiment structured as the cleaning apparatus of the wafer W, the second-liquid supply mechanism 40 can supply, as the second liquid, for example, a chemical liquid (diluted hydrofluoric acid, ammonia peroxide mixture (SC1), hydrogen peroxide mixture (SC2) used for chemically processing the wafer W, and a water particularly a deionized water (DIW) used for rinsing the wafer W.

As the supply system for supplying the second liquid to the processing units 50, a known supply system can be used, and thus no more detailed description is omitted herein.

Next, there is described the processing unit 50 that processes the wafer W by using the first liquid and the second liquid. As shown in FIGS. 3 and 4, each processing unit 50 includes: a holding mechanism 52 configured to hold the wafer W; a supporting member 60 configured to support the discharge opening 30a of the first supply line 30 and the discharge opening 45a of the second supply line 45; and a partition wall 54 defining a processing chamber for processing an object to be processed.

As shown in FIG. 3, the holding mechanism 52 is structured so as to hold the wafer W with the surface thereof being oriented along substantially the horizontal direction, and to rotate the wafer W held by the holding mechanism 52 about the center of the wafer W of a discoid shape as an axis.

As shown in FIGS. 3 and 4, the supporting member 60 is structured such that the discharge openings 30a and 45a supported by the supporting member 60 can be moved between a processing position (a position shown by the solid line in FIG. 4) at which the liquid can be supplied to the wafer W held by the holding mechanism 52, and a non-processing position (a position shown by the two-dot chain lines in FIG. 4) displaced from the processing position.

In the illustrated example, the supporting member 60 includes a rotatable tubular shaft member 64, and the arm 62 connected to the tubular shaft member 64. The arm 62 is swingable with the rotation of the tubular shaft member 64. The discharge opening 30a of the first supply line 30 and the discharge opening 45.a of the second supply line 45 are supported by one end area (distal area) 62a of the arm 62. The arm 62 is connected to one end of the tubular shaft member 64, which passes through the partition wall 54, through the other end area (proximal area) 62b of the arm 62. The tubular shaft member 64 has a cylindrical shape, and is rotatably held about a center axial line thereof. Due to this structure, as shown in FIG. 4, the discharge openings 30a and 45a supported by the supporting member 60 can be located at the processing position, i.e., a position where the discharge openings 30a and 45a face the center of the wafer W from above. In addition, the discharge openings 30a and 45a can be located at the non-processing position, i.e., a position laterally displaced from the area above the wafer W.

The discharge openings 30a and 45a of the supply lines 30 and 45 are supported on the distal area 62a of the arm 62 that can be located above the wafer W during the processing. Thus, as shown in FIGS. 3 and 4, at least parts of the supply lines 30 and 45, the parts being near to the discharge openings 30a and 45a, extend along the supporting member 60. In this embodiment, the first supply line 30 and the second supply line 45 extend substantially in parallel with each other along the arm 62. Note that, as shown in FIG. 3, the first supply line 30 extends on one side of the arm 62, and the second supply line 45 extends on the other side of the arm 62. Namely, the arm 62 of the supporting member 60 is structured as a partition member 63 extending between the first supply line 30 and the second supply line 45, so as to separate the passage of the first supply line 30 and the passage of the second supply line 45. To be specific, the first supply line 30 extends above the partition member 63 while being supported by the partition member 63, and the second supply line 45 extends below the partition member 63 while being supported by the partition member 63.

Further, as shown in FIGS. 3 and 4, a portion of the supporting member 60 is structured as a tubular portion 66 of a tubular shape. One of the first supply line 30 and the second supply line 45 passes inside the tubular portion 66 of the support member 60 to reach the corresponding liquid supply mechanism 15 or 40, and the other of the first supply line 30 and the second supply line 45 passes outside the tubular portion 66 of the supporting member 60 to reach the corresponding liquid supply mechanism 15 or 40.

More specifically, the tubular shaft member 64 of the supporting member 60 is formed as a part of the tubular portion 66. In addition, the proximal area 62b of the arm 62 connected to the tubular shaft member 64, i.e., a portion of the partition member 63, is formed as a part of the tubular portion 66. The second supply line 45 passes through the tubular portion 66. In detail, as shown in FIG. 3, the second supply line 45 extends through the inside of the tubular portion 66 formed in the arm 62, from the distal area 62a by which the discharge opening 45a is supported to the proximal area 62b of the arm 62. As shown in FIG. 3, the inside of the tubular portion 66 formed of a part of the arm 62 and the inside of the tubular portion 66 formed of the tubular shaft member 64 are communicated with each other. Thus, the second supply line 45 extends from the inside of the tubular portion 66 formed of a part of the arm 62 to the inside of the tubular portion 66 formed of the tubular shaft member 64. Then, as shown in FIG. 3, the second supply line 45 passes through the inside of the tubular portion 66 formed of the tubular shaft member 64 to penetrate the partition wall 54 of the processing unit 50.

On the other hand, as shown in FIGS. 3 and 4, the first supply line 30 extends from the distal area 62a of the arm 62 to the proximal area 62b of the arm 62 through the part outside the tubular portion 66 formed of a part of the arm 62. In the proximal area 62b of the arm 62, the first supply line 30 is separated from the supporting member 60 to penetrate the partition wall 54. A portion of the arm 62 (partition member 63), which is not structured as the tubular portion 66, is formed to have a planar shape. As described above, also in the area of the flat portion of the arm 62 (partition member 63), the first supply line 30 and the second supply line 45 are arranged apart from each other, with the arm 62 (partition member 63) being sandwiched therebetween.

Connected to the control device 12 are a keyboard by which commands are inputted by a process manager so as to manage the liquid processing apparatus 10, and an input and output device formed of a display or the like for visually displaying a working condition of the liquid processing apparatus 10, as shown in FIG. 1. The control device 12 is accessible to a storage medium 13 storing a program for realizing the processing performed by the liquid processing apparatus 10. The storage medium 13 may be formed of a known program storage medium, such as a memory such as a ROM or RAM, or a disc-like storage medium such as a hard disc, a CD-ROM, a DVD-ROM, or a flexible disc.

Figure 5:
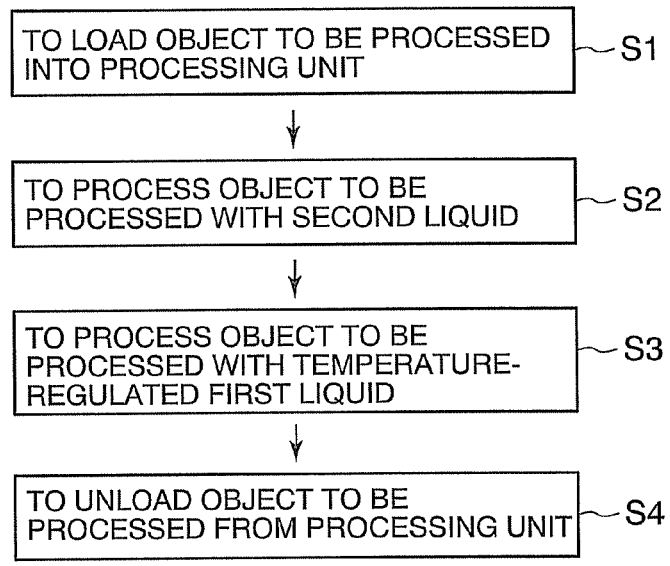
FIG. 5 is a flowchart for explaining an example of a liquid processing method that can be performed by using the liquid processing apparatus shown in FIG. 1.

Next, there is described an example of the liquid processing method capable of being performed by using the liquid processing apparatus as structured above. In the below-described liquid processing method, as shown in FIG. 5, a wafer W as an object to be processed is subjected to a cleaning process in the one processing unit 50. FIG. 5 shows a series of liquid processes. In a process step S3 using the first liquid, the wafer W is processed by using the heated first liquid supplied from the first-liquid supply mechanism 15 of the liquid processing apparatus 10. Herebelow, with reference to the flowchart shown in FIG. 5, there is briefly described the liquid processing method to be performed to the wafer W in the one processing unit 50, and then there is described the operation of the liquid processing apparatus 10 for performing the process step S3 using the first liquid.

The following operations of the respective constituent elements for performing the liquid processing method are controlled by control signals from the control device 12 based on the program previously stored in the program storage medium 13.

As shown in FIG. 5, the wafer W to be subjected to the cleaning process is loaded into each processing unit 50 of the liquid processing apparatus 10, and is held by the holding mechanism 52 in each processing unit 50 (process step S1).

Then, with the use of the second liquid, a process step S2 for processing the wafer W is performed. As a concrete example of the processing using the second liquid, the following process is performed. At first, diluted hydrofluoric acid (DHF) is supplied as the second liquid from the second-liquid supply mechanism 40, so that the wafer W is etched. Then, deionized water (DIW) is supplied as the second liquid from the second-liquid supply mechanism 40, so that the wafer W is rinsed. In this manner, the processing of the wafer W using two kinds of second liquid is performed. In this example, the second liquid supplied from the second-liquid supply mechanism 45 is not heated, and is used for the processing of the wafer W in the processing unit 50.

Thereafter, with the use of the heated first liquid, the process step S3 for processing the wafer W is performed (process step S3). As a concrete example of the processing using the first liquid, IPA heated at about 45 to 60° C. is supplied to the wafer W which has been etched by the diluted hydrofluoric acid (DHF) and rinsed by the deionized water. Thus, the deionized water remaining on the wafer W is substituted with the IPA, and then the IPA evaporates from the wafer W. Namely, with the use of the heated IPA, the drying process of the wafer W is performed. By using the heated IPA, when the IPA evaporates from the wafer W, an amount of heat to be absorbed from the wafer W can be decreased. Thus, lowering of temperature of the wafer W can be restrained, and dew condensation on the wafer W, which might invite watermarks, is unlikely to occur.

In the above manner, the cleaning process of the wafer W in the one processing unit 50 is finished, and the processed wafer W is unloaded from the processing unit 50 (process step S4).

Next, there is described the operation of the liquid processing apparatus 10 relating to the process step S3 for processing the wafer W by using the heated first liquid.

Figure 6:
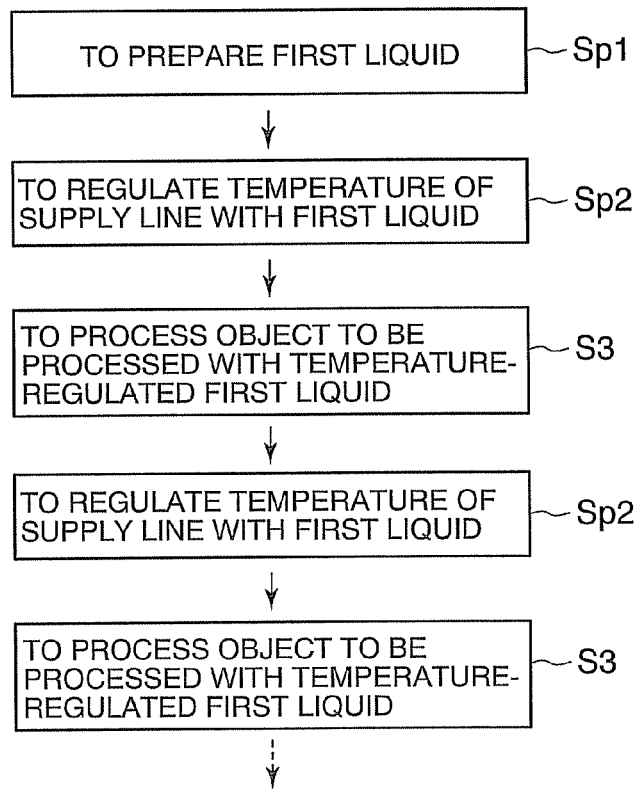
FIG. 6 is a flowchart for explaining operations of the liquid processing apparatus shown in FIG. 1 while performing a liquid process to an object to be processed.

As shown in FIG. 6, prior to the aforementioned process step S3 for processing the wafer W in the processing unit, there are firstly performed two preparatory processes, i.e., a process step Sp1 in which the first liquid is prepared, and a process step Sp2 in which a preheating is performed by using the heated first liquid.

As understood from the below description, the two processes, i.e., the process step Sp1 in which the first liquid is prepared and the process step Sp2 in which the preheating is performed by using the heated first liquid, will not exert any influence on the above process step S2 for processing the wafer W by using the second liquid, and the process step S1 for loading the wafer W. Meanwhile, the two preparatory process steps Sp1 and Sp2 should be completed before the process step S3 for processing the wafer W by using the first liquid in the processing unit 50. Thus, the two process steps, i.e., the process step Sp1 in which the first liquid is prepared and the process step Sp2 in which the preheating is performed by using the heated first liquid, may be performed prior to the above process step S1 for loading the wafer W and the process step S2 for processing the wafer W by using the second liquid, or may be performed simultaneously with these process steps S1 and S2.

The process step Sp1 in which the first liquid is prepared is described at first. In the process step Sp1, the first liquid is filled into the circulation line 20 from which the plurality of first supply lines 30 respectively in communication with the discrete processing units 50 extend. Specifically, the first liquid is supplied into the reservoir 22a from the replenishing mechanism, not shown, of the first-liquid supply source 22. The first liquid supplied to the reservoir 22a from the replenishing mechanism has been preferably heated to a predetermined temperature beforehand. Further, the heating mechanism 22b heats the first liquid supplied into the reservoir 22a. Thus, the reservoir 22a and the circulation path 24 of the circulation line 20 are filled with the first liquid. In addition, in this example, after the filling of the first liquid or simultaneously with the filling of the first liquid, the delivery mechanism 26 is activated, so that the first liquid circulates through the circulation line 20.

In the subsequent process steps, the heated first liquid flows into the respective first supply lines 30 from the circulation line 20 of the first-liquid supply mechanism 15, under conditions that the heated first liquid is driven by the delivery mechanism 26 so as to circulate through the circulation line 20 of the first-liquid supply mechanism 15. Then, the first liquid is discharged from the discharge openings 30a of the first supply lines 30 and consumed. During these operations, the not-shown replenishing mechanism of the first-liquid supply source 22 assembled in the first-liquid supply mechanism 15 replenishes the first liquid to the circulation line 20, and the heating mechanism 22b continuously heats and regulates the first liquid in the circulation line 20 such that the temperature of the first liquid is kept within a desired temperature range.

Then, with the use of the first liquid, the supply system for supplying the first liquid to the processing units 50 is heated (process step Sp2). To be specific, under conditions that the heated first liquid circulates through the circulation line 20 of the first-liquid supply mechanism 15, the first liquid is supplied from the circulation line 20 into the first supply line 30. Then, the flow path of the first liquid is preheated by the heated first liquid until the flow path has the same temperature as that of the first liquid.

As described above, the liquid processing apparatus 10 has the return lines 35 through which the first liquid having flowed into the first supply lines 30 is returned to the circulation line 20. During this process step Sp2 and the aforementioned process step Sp1 immediately before the process step Sp2, the flow-path control mechanism 38 disposed between the first supply line 30 and the return line 35 communicates the part of the first supply line 30, which is upstream of the liquid-supply switching valve (three-way valve) 38a forming the flow-path control mechanism 38, with the return line 35. Moreover, by means of the first relief valve 39a and the second relief valve 39b, the pressure of the first liquid in the return line 35 is regulated to be lower than the pressure of the first liquid in the circulation line 20. As a result, the first liquid having flowed from the circulation line 20 to the first supply line 30 is returned again to the circulation line 20 through the return line 35. That is to say, separately from the circulation route of the first liquid through the circulation line 20, there is defined a second circulation route for heating (preheating in this embodiment), which includes a part of the circulation line 20, a part of the first supply line 30, and the return line 35. Thus, the heated first liquid stably circulates through the second circulation route.

Since the heated first liquid circulates through the circulation route for preheating, the part of the supply system for supplying the first liquid to the processing unit 50, the part defining the preheating circulation route, can be heated to the same temperature as the temperature of the heated first liquid. In other words, a part of the first supply line 30 and the return line 35 are heated to the same temperature as that of the heated first liquid. Further, the liquid-supply switching valve (three-way valve) 38a and the opening and closing valve 38b of the flow-path control mechanism 38 are disposed on the preheating circulation route. Namely, in the process step Sp2, the valves having large heat capacities can be preheated.

During the preheating process step Sp2, the opening and closing valve 33 disposed on the second pipeline 31b of the first supply line 30 is opened. Thus, the first liquid flows through both the first pipeline 31a and the second pipeline 31b. The flow rate of the first liquid flowing from the circulation line 20 to the first supply line 30 has been previously set by regulating the manual flow-rate regulating valve 37, and is monitored by the flowmeter 36.

In this example, also in the aforementioned filling process step Sp1, the liquid-supply switching valve (three-way valve) 38a communicates the upstream part of the first supply line 30 with the return line 35, in order to stop the supply of the first liquid to the processing unit 50. Thus, also in the filing process step Sp1, the part of the first supply line 30 and the valves 38a and 38b are filled with the heated first liquid so as to be heated. In this regard, the process step Sp1 for preparing the first liquid and the process step Sp2 for preheating the first supply line 30 by using the first liquid may be performed at the same time.

Following to the preheating process step Sp2, the valves 38*a* and 38*b* are switched, thereby to discharge the heated first liquid from the discharge opening 30*a* of the first supply line 30, whereby the aforementioned process step S3 for processing the wafer W is performed. Specifically, the liquid-supply switching valve 38*a* of the flow-path control mechanism 38 communicates the upstream part of the first supply line 30, not with the return line 35, but with the downstream part of the first supply line 30. At this time, the wafer W in the processing unit 50 is held by the holding mechanism 52 and is driven so as to be rotated by the holding mechanism 52. Then, the heated first liquid is discharged toward the wafer W from the discharge opening 30*a* supported by the supporting member 60 at the processing position where the discharge opening 30*a* faces the rotating wafer W.

While the first liquid is being discharged from the discharge opening 30, the supporting member 60 may be swung such that the discharge opening 30*a* is moved from the position facing the central part of the wafer W to the position facing the peripheral part of the wafer W. In addition, there may be provided a discharge opening for discharging an inert gas (e.g., nitrogen) in the vicinity of the discharge opening 30*a*. In this case, an inert gas is discharged together with the discharge of the first liquid, whereby the drying of the first liquid can be promoted.

As described above, in the preheating process step Sp2 that has been performed beforehand, the first supply line 30 and the liquid-supply switching valve 38*a* have been preheated to have substantially the same temperature as that of the heated first liquid. As shown in FIG. 3, the return line 35 defining the preheating circulation route is connected to the first supply line 30 at the position near to the discharge opening 30*a*.

During the process step S3, the opening and closing valve 33 disposed on the second pipeline 31*b* of the first supply line 30 is closed. Thus, the first liquid flows only through first pipeline 31*a* out of the first pipeline 31*a* and the second pipeline 31*b*. The flow rate of the first liquid flowing from the circulation line 20 to the first supply line 30 is previously set by regulating the manual flow-rate regulating valve 32, and is monitored by the flowmeter 36.

That is to say, while the wafer W is not being processed in the processing unit 50, the first liquid flows through two or more pipelines 31*a* and 31*b* of the plurality of pipelines extending in parallel with each other and forming the zone of the first supply lines 30. On the other hand, while the wafer W is being processed in the processing unit 50, the first liquid flows only through the pipeline 31*a* included in the above two or more pipelines 31*a* and 31*b* of the plurality of pipelines extending in parallel with each other and forming the zone of the first supply lines 30. As a result, an amount per unit time of the first liquid flowing through each return line 35 while the first supply line 30 is being heated is larger than an amount per unit time of the first liquid that is discharged from the discharge opening 30*a* of the corresponding first supply line 30 while the wafer W is being processed.

According to this method, the wafer W can be processed with the suitable amount of first liquid. In the preheating, the heated first liquid can be supplied at a large flow rate into the preheating circulation route including the first supply line 30 and the return line 35. Thus, the circulation route can be heated for a short period of time, up to the same temperature as the temperature of the first liquid.

Moreover, the pipeline 31*a* through which the first liquid passes when the wafer W is processed by using the first liquid is a pipeline that defines the preheating circulation route in the preheating process. When the processing is started, the pipeline 31*a* has been already heated to the same temperature as that of the first temperature. Thus, during the processing of the wafers W with the use of the first liquid, variation in temperature of the first liquid can be restrained, whereby non-uniformity of the processing of the wafers W can be effectively restrained.

Connected to each processing unit 50 are the first supply line 30 through which the heated first liquid flows, and the second supply line 45 through which the second liquid different from the first liquid in temperature flows. Both the first supply line 30 and the second supply line 45 are supported by the supporting member 60 and extend substantially in parallel with each other. In this embodiment, the second supply line 45 extends inside of the tubular portion 66 of the supporting member 60, and the first supply line 30 extends outside the tubular portion 66 of the supporting member 60. In particular, the second supply line 45 passes inside the tubular portion 66 and penetrates the partition wall 54 defining the process chamber, so as to extend outside the process chamber where a degree of freedom of setting the routes of the supply lines 30 and 45 is significantly increased, as compared with the inside of the process chamber. In addition, the partition member 63 formed of the arm 62 extends between the first supply line 30 and the second supply line 45, whereby the route of the first supply line 30 and the route of the second supply line 45 are separated from each other by the partition member 63. Namely, in the distal area 62*a* of the arm 62 where the tubular portion 66 is not formed, the first supply line 30 and the second supply line 45 extend on the different sides of the partition member 63 formed of the arm 62 that is sandwiched between the first supply line 30 and the second supply line 45. From these structures, movement of heat between the first liquid in the first supply line 30 and the second liquid in the second supply line 45 can be remarkably effectively restrained. Thus, the first liquid of an expected temperature can be discharged from the discharge opening 30*a* of the first supply line 30, and the second liquid of an expected temperature can be discharged from the discharge opening 45*a* of the second supply line 45.

The process step S3 for processing the wafer W by using the first liquid as described above is finished, when the liquid-supply switching valve 38*a* disposed on the first supply line 30 connects the upstream part of the first supply line 30 to the return line 35 so that the supply of the heated first liquid to the processing unit 50 is stopped. At this time, in accordance with the action of the liquid-supply switching valve 38*a*, the opening and closing valve 38*b* on the return line 35 is opened. As a result, the circulation route for regulating temperature (the circulation route for heating (heating circulation route)), which includes the first supply lines 30 and the return lines 35, is formed again, whereby the first liquid having flowed from the circulation line 20 to the first supply line 30 flows through the heating circulation route.

That is to say, as shown in FIG. 6, the temperature regulating (heating) process step Sp2 is started again. The heating process step Sp2 can be performed until the processing of a wafer to be subsequently processed, which has been transferred to the processing unit 50, by using the second liquid is finished, and the processing of the wafer to be subsequently processed by using first liquid (process step S3) is started. In this manner, by repeating the heating process step Sp2 and the process step S3 using the first liquid, the temperatures of the first supply lines 30 and the liquid-supply switching valves 38*a* can be maintained throughout the process step S3 using the first liquid. As a result, in the process step S3 using the first liquid, variation in temperature of the first liquid to be supplied to the wafer W can be effectively restrained.

As described above, the liquid processing apparatus 10 according to this embodiment includes: the liquid supply mechanism 15 configured to supply a liquid; the supply line 30 connected to the liquid supply mechanism 15, the supply line 30 having the discharge opening 30a configured to discharge the temperature-regulated liquid; the processing unit 50 configured to support the supply line 30 and to be capable of processing an object to be processed W by using the temperature-regulated liquid discharged from the discharge opening 30a of the supply line 30; the return line 35 configured to return the liquid supplied to the supply line 30 to the liquid supply mechanism 15; and the liquid-supply switching valve 38a, 34 (opening and closing valve 34 is discussed with respect to FIG. 7 in later paragraphs) disposed on the supply line 30, the liquid-supply switching valve 38a being configured to switch between the supply of the liquid to be used for processing the object to be processed W in the processing unit 50 to the discharge opening 30a, and the stoppage of the liquid supply, wherein the liquid-supply switching valve 38a, 34 is located on the route of the liquid that returns from the supply line 30 to the liquid supply mechanism 15 through the return line 35. In addition, the liquid processing method according to this embodiment includes: regulating the temperature of the supply line 30 by returning the temperature-regulated liquid, which has flowed from the liquid supply mechanism 15 into the supply line 30, to the liquid supply mechanism 15 through the return line 35, so that the temperature-regulated liquid circulates through the route including the supply line 30 and the return line 35; and discharging the temperature-regulated liquid, which has flowed from the liquid supply mechanism 15 into the supply line 30, from the discharge opening 30a of the supply line 30, so as to process the object to be processed W, wherein during the temperature regulation of the supply line 30, the temperature of the liquid-supply switching valve 38a, 34 is also regulated, the liquid-supply switching valve 38a, 34 being disposed on the supply line 30 and configured to switch between the supply of the liquid to be used for processing the object to be processed W in the processing unit 50 to the discharge opening 30a, and the stoppage of the liquid supply.

That is to say, in this embodiment, since there is provided the return line 35 configured to return the first liquid, which has flowed from the circulation line 20 to the first supply line 30, to the circulation line 20, the heated first liquid can circulate not only through the circulation line 20, but also through the circulation route including the first supply line 30 and the return line 35. Thus, before the process using the first liquid is started in the processing unit 50, at least a part of the first supply line 30 can be preheated up to the same temperature as that of the first liquid, by using the heated first liquid.

Particularly in this embodiment, the liquid-supply switching valve 38a, which switches between the supply of the liquid to be used for processing the object to be processed W in the processing unit 50, and the stoppage of the liquid supply, is located on the preheating circulation route in which the first liquid returns from the first supply line 30 to the first-liquid supply mechanism 15 through the return line 35. It is not generally necessary to further provide valves in the first supply line 30 extending into the processing unit 50 at a position downstream of the liquid-supply switching valve 38a. Thus, in this embodiment, the liquid-supply switching valve 38a is a valve that is disposed on the most downstream side in the first supply line 30 extending toward the processing unit 50. Therefore, before the processing of the wafer W is started in the processing unit 50 and while the processing of the wafer W is being performed in the processing unit 50, it is possible to heat (preheat) all the valves disposed on the first supply line 30 that supplies the heated first liquid to the processing unit 50. In general, the valves have significantly larger heat capacities as compared with the pipes constituting the first supply line 30. Thus, according to this embodiment capable of stabilizing the temperatures of the valves, variation in temperature of the heated first liquid to be used for the processing in the processing unit 50 can be remarkably effectively restrained, as compared with the conventional apparatus and method.

The liquid processing apparatus 10 according to this embodiment includes: the circulation line 20 having the liquid supply source 22 configured to supply a temperature-regulated liquid, and the circulation path 24 through which the liquid from the liquid supply source 22 can circulate; the plurality of supply lines 30 branched from the circulation path 24 of the circulation line 20; the plurality of processing units 50 disposed correspondingly to the respective supply lines 30, each processing units 50 being configured to be capable of processing an object to be processed W by using the temperature-regulated liquid discharged from each supply line 30; and the plurality of return lines 35 configured to return the liquid having flowed from the circulation line 20 to the respective supply lines 30 to the circulation line 20, wherein each return line 35 is connected to the circulation line 20 at a position downstream of the connection position where the most downstream-side supply line of the plurality of supply lines 30 is connected to the circulation line 20. In addition, the liquid processing method according to this embodiment includes: filling the liquid to the circulation line 20, which has the circulation path 24 from which the plurality of supply lines 30 respectively extend into the discrete processing units 50, and the liquid supply source 22 configured to supply a temperature-regulated liquid to the circulation path 24; and making the temperature-regulated liquid flow into the respective supply lines 30 from the circulation line 20, under conditions that the temperature-regulated liquid circulates through the circulation line 20, wherein while the temperature-regulated liquid is made to flow into the supply lines 30, in each of the plurality of processing units, the temperature-regulated liquid having flowed from the circulation line 20 to the supply line 30 is returned through the return line 35 to the circulation line 20 at a position downstream of the connection position where the most downstream-side supply line of the plurality of supply lines 30 is connected to the circulation line 20, so that the temperature-regulated liquid circulates through the route including the supply lines 30 and the return lines 35, so as to regulate the temperatures of the supply lines 30; and thereafter, the temperature-regulated liquid having flowed from the circulation line 20 to the supply line 30 is discharged from the discharge opening 30a of the supply line 30, to thereby process the object to be processed W.

Namely, the return line 35 is connected to the circulation line 20 on a position downstream of the connection position where the most downstream-side supply line of the plurality of supply lines 30 is connected to the circulation line 20. The reference of the downstream side is a liquid flow of the liquid in the circulation line 20, the liquid being supplied from the liquid supply source 22 to the circulation path 24. Thus, during the heating process step Sp2, the first liquid, which has been used for the preheating process so that the temperature thereof is possibly lowered, will not be directly sent to another processing unit 50 so as to be used for the processing of the wafer W in this processing unit 50. On the contrary, the first liquid used for the preheating process is again sent from the circulation line 20 to one of the first supply lines 30, by way of the liquid supply source 22 to which the heated liquid is replenished, the liquid supply source 22 having the heating mechanism 22b. Thus, although the liquid processing apparatus 10 is equipped with a number of processing units 50, and the wafers W are processed in the respective processing units 50 at different timings, it is possible to stabilize the temperature of the first liquid to be supplied from the circulation line 20 to the respective first supply lines 30. Namely, it can be restrained that the processing of the wafer W performed in the certain processing unit 50 exerts an influence on the processing of the wafer W performed in another processing unit 50. Thus, in the respective processing units 50, the processing using the heated first liquid can be stably performed, whereby it is possible to effectively restrain that a degree of the processing of the wafer W using the heated first liquid varies from the one processing unit 50 to another processing unit 50.

Further, since the return line 35 is disposed separately from the circulation line 20 but correspondingly to the first supply line 30 in communication with each processing unit, the return line 35 can be connected to the corresponding first supply line 30 at a position near to the discharge opening 30a of the first supply line 30. Thus, lowering of temperature of the first liquid upon starting of the processing in the processing unit 50 can be effectively restrained. In addition, since the liquid used for the heating process circulates through the circulation route including the first supply lines 30 and the return lines 35, an amount of the first liquid to be consumed can be prevented from increasing.

Therefore, according to the embodiment, variation in temperature of the heated first liquid can be restrained while one wafer W is being processed. At the same time, difference in temperature of the first liquid, which is used for processing the several wafers W in the one processing unit 50 or in the several processing units 50, can be restrained. As a result, the processing rarely varies from wafer to wafer, and the wafers W can be stably processed.

In addition, according to this embodiment, an amount per unit time of the first liquid flowing through each return line 35 while the wafer W is not being processed in the processing unit 50 is larger than an amount per unit time of the first liquid that is discharged from the discharge opening 30a of the first supply line 30 while the wafer W is being processed in the processing unit 50. Thus, the preheating of the circulation route including the first supply lines 30 and the return lines 35 can be performed for a short period of time. Namely, even when the processings are intermittently performed in the processing unit 50 for a short period of time, the circulation route including the first supply lines 30 and the return lines 35 can be sufficiently preheated, whereby lowering of temperature of the first liquid upon starting of the processing can be effectively restrained.

In addition, the liquid processing apparatus 10 according to this embodiment includes: the first supply line 30 configured to supply the first liquid, the first supply line 30 having the discharge opening 30a configured to discharge the first liquid; the second supply line 45 configured to supply the second liquid different from the first liquid in temperature, the second supply line 45 having the discharge opening 45a configured to discharge the second liquid; and the processing unit 50 having the supporting member 60 configured to support the first supply line 30 and the second supply line 45, the processing unit 50 being configured to be capable of processing an object to be processed W by using the first liquid and the second liquid, wherein the supporting member 60 has the partition member 63, one of the first supply line 30 and the second supply line extends on one side of the partition member 63, and the other of the first supply line 30 and the second supply line 45 extends on the other side of the partition member 63. In addition, the liquid processing method according to this embodiment includes: processing the object to be processed W by using the first liquid supplied from the first supply line 30; and processing the object to be processed W by using the second liquid different from the first liquid in temperature, which is supplied from the second supply line 45, wherein: the processing of the object to be processed W by using the second liquid is performed before or after the processing of the object to be processed W by using the first liquid; when the object to be processed W is processed by using the first liquid, the first liquid is discharged from the discharge opening 30a of the first supply line 30 supported by the supporting member 60; on the other hand, when the object to be processed W is processed by using the second liquid, the second liquid is discharged from the discharge opening 45a of the second supply line 45 supported by the supporting member 60 which supports the first line 30; and one of the first supply line 30 and the second supply line extends on one side of the partition member 63 constituting at least a part of the supporting member 60, and the other of the first supply line 30 and the second supply line 45 extends on the other side of the partition member 63.

Recently, many liquid processing apparatuses are provided with a plurality of liquid supply lines, and temperatures of liquids to be supplied through the liquid supply lines can be set variously. In order to enable to continuously process objects to be processed by using different liquids, the plurality of supply lines are generally arranged in parallel with each other, and discharge openings thereof for discharging liquids are aligned. In such apparatuses, there is a possibility that, when liquid of different temperatures are supplied to the supply lines, heat might be exchanged between the liquids of different temperatures. In this case, even when the liquid whose temperature has been regulated to a desired temperature can be sent to each supply line, the liquid actually discharged from the discharge opening and used for a processing has a temperature different from the expected temperature.

On the contrary, according to this embodiment, one of the first supply line 30 and the second supply line 45 extends to the corresponding liquid supply mechanism 15 or 40 along one side of the partition member 63 of the supporting member 60, and the other of the first supply line 30 and the second supply line 45 extends to the corresponding liquid supply mechanism 15 or 40 along the other side of the partition member 63 of the supporting member 60. Thus, it can be effectively restrained that heat is moved between the first liquid in the first supply line 30 and the second liquid in the second supply line 45. As a result, the first liquid can be supplied at a desired temperature, as well as the second liquid can be supplied at a desired temperature.

The above embodiment can be variously modified. Hereafter, examples of such modifications are described.

For example, in the above embodiment, the flow-rate regulating valve 37 whose opening degree can be manually adjusted is disposed on the first supply line 30 at a position upstream of the position where the first pipeline 31a and the second pipeline 31b are branched. However, not limited thereto, as shown by the two-dot chains in FIG. 2, the flow-rate regulating valve 37 may be disposed on the second pipeline 31b. In this modification, an amount of the liquid capable of passing through the first pipeline 31a is decided by the flow-rate regulating valve 32, and an amount of the liquid capable of passing through the second pipeline 31b is decided by the flow-rate regulating valve disposed on the second pipeline 31b.

Further, in the above embodiment, the certain zone of the first supply line 30 is divided into the two pipelines 31a and 31b. However, not limited thereto, the zone of the first supply line 30 may be divided into three or more pipelines, for example. Similarly, two or more zones of the first supply line 30 may be divided into a plurality of pipelines. In these modifications, by suitably changing a combination of the pipelines to be closed or opened, a flow rate of the first liquid capable of flowing from the circulation line 20 into the first supply line 30 can be changed to various values.

Furthermore, in the above embodiment, the return line 35 is connected to an intermediate position of the first supply line 30, i.e., a position between the discharge opening 30a and the circulation line 20. However, not limited thereto, as shown in FIG. 7, for example, the return line 35 may be connected to the discharge opening 30a of the first supply line 30. Herein, the "connection" includes not only a state where the return line 35 and the discharge opening 30a of the first supply line 30 are in contact and connected to each other, but also a state where the return line 35 and the discharge opening 30a of the first supply line 30 are connected to each other via a flow path through which a liquid flows from the discharge opening 30a into the return line 35.

In the example shown in FIG. 7, a cup-shaped end 35a of the return line 35 can be connected to the discharge opening 30a of the first supply line 30 located on the non-processing position. In particular, the cup-shaped end 35a of the return line 35 may be structured so as to be relatively movable with respect to the discharge opening 30a located on the non-processing position, whereby the cup-shaped end 35a can move close to the discharge opening 30a and away from the discharge opening 30a. Moreover, the cup-shaped end 35a of the return line 35 may be hermetically connectable with the discharge opening 30a located on the non-processing position. In the heating process step Sp2, the return line 35 is adapted to collect the first liquid discharged from the discharge opening 30a of the first supply line 30. In addition, in this example, an opening and closing valve 34 driven by a fluid pressure is disposed on the first supply line 30. The opening and closing valve 34 functions as a liquid-supply switching valve configured to switch between supply of a liquid, which is used in the processing of the object to be processed in the processing unit 50, and stoppage of the liquid supply. According to this example, since the overall first supply line 30 is included in a heating circulation route, the first supply line 30 can be entirely heated. Namely, since all the valves, e.g., the liquid-supply switching valve (opening and closing valve) 34 and so on, provided on the first supply line 30 are positioned on the heating circulation route, all the valves can be heated.

In the modification shown in FIG. 7, in order to enable movement of the cup-shaped end 35a, a part 35b of the return line 35 is made flexible and extensible. The other structure of the modification shown in FIG. 7 may be the same as that of the above embodiment, and the overlapping description is omitted.

Still furthermore, in the above embodiment, the flow-path control mechanism, opening and closing valve 34, is structured such that the flow-path control mechanism, opening and closing valve 34, can selectively maintain the state in which the first liquid having flowed through the first supply line 30 up to the flow-path control mechanism, opening and closing valve 34, further flows through the first supply line 30 only toward the discharge opening 30a, and the state in which the first liquid flows toward the return line 35. However, not limited thereto, as shown in FIG. 8, for example, the flow-path control mechanism 38 may be structured such that the flow-path control mechanism 38 can selectively maintain a state in which the first liquid having flowed through the first supply line 30 up to the flow-path control mechanism 38 flows toward both the discharge opening 30a and the return line 35, and a state in which the first liquid flows only toward the return line 35. In the example shown in FIG. 8, the flow-path control mechanism 38 includes: a three-way valve 38a driven by a fluid pressure, the three-way valve 38a being disposed on the first supply line 30 and connected to one end of the return line 35; and a flow-rate control valve 38c disposed on the return line 35. The flow-rate control valve 38c is formed of a valve (e.g., a mass flow controller) incorporating a drive unit capable of adjusting an opening degree of the valve based on a control signal from the control device 12. Also in this modification, similarly to the above embodiment, the three-way valve 38a functions as a liquid-supply switching valve configured to switch between supply of a liquid, which is used in the processing of the object to be processed in the processing unit 50, and stoppage of the liquid supply.

In this modification, a flow rate of the first liquid flowing from the circulation line 20 to the first supply line 30 is maintained at a certain flow rate (e.g., A (l/min)) by the flow-rate regulating valve 37. When the three-way valve 38a connects the upstream part of the first supply line 30 only to the return line 35, the opening degree of the flow-rate control valve 38c is set such that the first liquid can flow at a flow rate larger than the certain flow rate (e.g., A (l/min)) allowed by the flow-rate regulating valve 37. On the other hand, when the three ways of the three-way valve 38a are opened, the opening degree of the flow-rate control valve 38c is set such that the first liquid can flow at a flow rate (e.g., B (l/min)) which is smaller than the certain flow rate (e.g., A (l/min)) allowed by the flow-rate regulating valve 37. In this case, a flow rate of the first liquid to be discharged from the discharge opening 30a can be a difference (e.g., (A−B) (l/min)) between the flow rate (e.g., A (l/min)) of the first liquid which may flow into the first supply line 30 and the flow rate (e.g., B (l/min)) of the first liquid which may flow through the return line 35.

In this modification, while the wafer W is being processed by using the first liquid, the heated first liquid circulates through the heating circulation route including the return lines 35 and the first supply lines 30. Thus, even when the heating process step Sp2 and the process step S3 are repeated in each processing unit 50, the temperature of the first liquid circulating through the heating circulation route including the return lines 35 and the first supply lines 30, and the temperature of the first liquid circulating through the circulation line 20, can be substantially prevented from varying. Thus, variation in temperature of the heated first liquid to be used in the processing can be further effectively restrained.

The other structure of the modification shown in FIG. 8 may be the same as that of the above embodiment, and the overlapping description is omitted.

Further, in the above embodiment, the second supply line 45 extends inside the tubular portion 66 a part of which is formed by the partition member 63, and the first supply line 30 extends outside the tubular portion 66. However, not limited thereto, the first supply line 30 may extend inside the tubular portion 66, and the second supply line 45 may extend outside the tubular portion 66. Furthermore, as shown in FIG. 9, the first supply line 30 may extend inside a first tubular portion 66a, and the second supply line 45 may extend inside a second tubular portion 66b different from the first tubular portion 66a. In the modification shown in FIG. 9, an interface between the first tubular portion 66a and the second tubular portion 66b is formed by the partition member 63. FIG. 9 is a view for explaining a modification of the arm 62 (partition member) of the supporting member 60, showing a cross-section of the supporting member 60 which is perpendicular to the longitudinal direction of the arm 62. The other structure of the modification shown in FIG. 9 may be the same as that of the above embodiment, and the overlapping description is omitted.

Furthermore, in the above embodiment, the second liquid is not heated. However, not limited thereto, the aforementioned useful effect can be expected when the second liquid is heated.

Still furthermore, in the above embodiment, the heating mechanism 22b is assembled in the first-liquid supply mechanism 15 so as to heat the first liquid in the reservoir 22. However, not limited thereto, there may be further provided a heating mechanism for heating the heating path 24 of the heating line 20, for example. In addition, there may be further provided heating apparatuses for heating the first supply lines 30 and the return lines 35.

Still furthermore, in the above embodiment, the processing by means of the second liquid is performed at first, and the processing by means of the heated first liquid follows thereto. However, not limited thereto, the processing by means of the heated first liquid may be performed prior to the processing by means of the second liquid.

Some modifications of the above embodiment have been described above, and the modifications can be suitably combined.

Moreover, as described above, the present invention can be applied to a processing other than the cleaning process of a wafer, and the first liquid to be heated can be a liquid other than the drying liquid.

What is claimed is:

1. A liquid processing apparatus configured to process an object to be processed by using a temperature-regulated liquid, the liquid processing apparatus comprising:
    a liquid supply mechanism configured to supply a liquid;
    a supply line connected to the liquid supply mechanism, the supply line having a discharge opening for discharging the temperature-regulated liquid;
    a processing unit supporting the supply line, the processing unit being configured to be capable of processing the object to be processed by using the temperature-regulated liquid discharged from the discharge opening of the supply line;
    a return line configured to return the liquid supplied to the supply line to the liquid supply mechanism;
    a liquid-supply switching valve structured as a three-way valve disposed on the supply line and connected to one end of the return line, the liquid-supply switching valve being configured to switch between supply of the liquid, which is used in the processing of the object to be processed in the processing unit, to the discharge opening, and stoppage of the liquid supply;
    a first opening and closing valve disposed on the return line;
    a second opening and closing valve disposed on the supply line;
    a control unit configured to control opening and closing of the liquid-supply switching valve, the first opening and closing valve, and the second opening and closing valve;
    a flowmeter disposed on the supply line; and
    a flow-rate regulating valve whose opening degree can be adjusted, the flow-rate regulating valve being disposed on the supply line,
    wherein the supply line is divided into a first pipeline and a second pipeline at least in one zone at a position downstream of a connection position where the supply line is connected to the liquid supply mechanism and the first pipeline and the second pipeline are joined together upstream of a connection position where the supply line and the return line are connected to each other,
    wherein the flowmeter is disposed at a position of the supply line upstream of the one zone where the supply line is divided into the first pipeline and the second pipeline,
    wherein the flow-rate regulating valve is disposed on the first pipeline,
    wherein the second opening and closing valve is disposed on the second pipeline,
    wherein the first opening and closing valve is disposed at a position of the return line downstream of the liquid-supply switching valve,
    wherein the control unit is programmed to control valves such that
    when the object to be processed is not being processed in the processing unit, the second opening and closing valve opens the second pipeline to have the liquid pass through both of the first and second pipelines, the liquid supply switching valve communicates an upstream-side supply line which is a part of the supply line located upstream of the liquid-supply switching valve with only the return line, and the first opening and closing valve opens the return line and
    when the object to be processed is being processed in the processing unit, the second opening and closing valve closes the second pipeline to have the liquid pass only through the first pipeline at a flow-rate regulated by the flow-rate regulating valve, the liquid-supply switching valve communicates the upstream-side supply line with both of the return line and a downstream-side supply line which is part of the supply line located downstream of the liquid-supply switching valve, and the first opening and closing valve closes the return line,
    whereby a flow rate of the liquid is controlled such that an amount per unit time of the liquid flowing through the return line while the object to be processed is not being processed in the processing unit is larger than an amount per unit time of the liquid that is discharged from the discharge opening of the supply line while the object to be processed is being processed in the processing unit.

2. The liquid processing apparatus according to claim 1, wherein:
    a first relief valve is disposed on the circulation line at a position between a connection position where the circulation line and the most downstream-side supply line are connected and a connection position where the circulation line and the return line are connected; and
    a second relief valve whose set pressure is set lower than a set pressure of the first relief valve is disposed on the return line.

3. The liquid processing apparatus according to claim 1, further comprising a second supply line configured to supply a second liquid different in temperature from the liquid discharged from the discharge opening of the supply line, the second supply line having a discharge opening for discharging the second liquid,
    wherein:
    the processing unit includes a supporting member configured to support the supply line and the second supply line;
    the supporting member has a partition member; and
    one of the supply line and the second supply line extends on one side of the partition member and the other of the supply line and the second supply line extends on the other side of the partition member.

4. The liquid processing apparatus according to claim 1,
wherein the liquid supply mechanism includes a circulation line having a liquid supply source and a circulation path through which the liquid from the liquid supply source can circulate;
wherein the supply line includes a plurality of supply lines divided from the circulation path of the circulation line;
wherein the processing unit and the return line are provided correspondingly to each of the plurality of supply lines; and
wherein the return lines are merged and ends of the merged return lines are connected to the circulation line at a position downstream of a connection position where the most downstream-side supply line of the plurality of supply lines is connected to the circulation line.

* * * * *